(12) United States Patent
Murayama

(10) Patent No.: US 6,683,899 B2
(45) Date of Patent: Jan. 27, 2004

(54) SEMICONDUCTOR LASER AND METHOD OF PRODUCING THE SAME

(75) Inventor: Minoru Murayama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 124 days.

(21) Appl. No.: 10/020,908

(22) Filed: Dec. 19, 2001

(65) Prior Publication Data

US 2002/0080837 A1 Jun. 27, 2002

(30) Foreign Application Priority Data

Dec. 22, 2000 (JP) .................................... 2000-391120

(51) Int. Cl.⁷ ............................................. H01S 5/227
(52) U.S. Cl. ............................................. 372/46
(58) Field of Search ............................................. 372/46

(56) References Cited

U.S. PATENT DOCUMENTS 6,081,541 A * 6/2000 Adachi et al. ............... 372/45

* cited by examiner

*Primary Examiner*—James Davie
(74) *Attorney, Agent, or Firm*—Rabin & Berdo, P.C.

(57) ABSTRACT

A semiconductor laser having a lower clad layer, an active layer, a first upper clad layer and a dry-etching stop layer, all the layers being successively laminated on a compound semiconductor substrate. The semiconductor laser further includes (i) a second upper clad layer, in the form of a ridge, formed above the first upper clad layer, (ii) an etching stop layer present only between the dry-etching stop layer and the second upper clad layer, and (iii) block layers formed at sides of the second upper clad layer.

4 Claims, 4 Drawing Sheets

SEMICONDUCTOR LASER AND METHOD OF PRODUCING THE SAME

BACKGROUND OF THE INVENTION

1. Field of the Invention

The present invention relates to a semiconductor laser to be used as a writing/reading light source for an optical disc device such as a DVD-ROM drive, a DVD-R drive, a DVD-RW drive, a DVD-RAM drive or the like, a writing light source for an LBP (laser beam printer) or the like, and a reading light source for a bar code scanner or the like. The present invention also relates to a method of producing the semiconductor laser above-mentioned.

2. Description of Related Arts

A writing/reading light source for an optical recording device indispensably requires a semiconductor laser capable of conducting oscillation in a short wavelength. A semiconductor laser having a composition of the AlGaInP type satisfies this requirement. To improve the recording speed, it is also required to drive a high-output laser light in a moment. A ridge-type semiconductor laser using a compound semiconductor satisfies this requirement.

FIG. 3 is a schematic section view illustrating the arrangement of a general ridge-type semiconductor laser of prior art. A lower clad layer 22 is formed on a substrate 21. An active layer 23 is formed on the lower clad layer 22. A first upper clad layer 24 is formed on the active layer 23. An etching stop layer 25 is formed on the first upper clad layer 24.

A second upper clad layer 26 and a contact layer 27 both in the form of a ridge, are laminated on the etching stop layer 25 in the form of a continuous film, thus forming a ridge portion 32. On the etching stop layer 25, block layers 30 are formed at both sides of the ridge portion 32. That is, the etching stop layer 25 is present under the second upper clad layer 26 and also under the block layers 30.

A cap layer 31 is formed on the contact layer 27 and the block layers 30.

FIG. 4(a) to FIG. 4(e) are schematic section views illustrating the steps of producing the above-mentioned general ridge-type semiconductor laser of prior art. Successively formed on the substrate 21 are the lower clad layer 22, the active layer 23, the first upper clad layer 24, the etching stop layer 25, the second upper clad layer 26 and the contact layer 27. A mask layer 28 is then formed, and a resist pattern 29 is formed on the mask layer 28 (FIG. 4(a)).

The etching stop layer 25 has a composition of the GaInP type or the like, and the active layer 23 has a composition of the AlGaInP type, the GaInP type or the like. Each of the substrate 21 and the contact layer 27 has a composition of GaAs or the like. Other semiconductor portions have a composition of the AlGaInP type or the like. The mask layer 28 is generally composed of SiO$_2$ or SiN.

Then, the mask layer 28 is etched in the pattern of the resist 29 (FIG. 4(b)).

After the resist 29 is removed, the contact layer 27 and the second upper clad layer 26 are etched in the form of a ridge (FIG. 4(c)). Since the etching stop layer 25 is resistant to the etching medium, the layers on and lower than the etching stop layer 25 are not etched.

Then, the block layers 30 are selectively grown at both sides of the ridge portion 32 (FIG. 4(d)). After the selective growth of the block layers 30, the mask layer 28 is removed and the cap layer 31 is then grown (FIG. 4(e)).

Each of the block layers 30 and the cap layer 31 has a composition of GaAs or the like.

In the semiconductor laser having the arrangement above-mentioned, the etching stop layer 25 is present between the block layers 30 and the first upper clad layer 24. This disadvantageously relaxes the hetero-barrier between the block layers 30 and the first upper clad layer 24, thereby to increase a leak electric current from the block layers 30. This lowers the current confinement effect for the second upper clad layer 26. The oscillation efficiency of the semiconductor laser is therefore lowered.

In view of the foregoing, the etching stop layer 25 is preferably not present, in a finished product, between the block layers 30 and the first upper clad layer 24.

In this connection, it may be proposed to remove, using an etching solution such as a solution of sulfuric acid or the like, the etching stop layer 25 exposed after the second upper clad layer 26 has been etched. However, as soon as the etching stop layer 25 is removed, there is exposed the first upper clad layer 24 which is etched at a higher etching rate. Etching control in the depth direction is therefore difficult.

It is also proposed that the exposed etching stop layer 25 is removed by thermal decomposition (Japanese Laid-Open Patent Publication (KOKAI) 4-130692). In this case, however, the application of heat causes the elements (including dopants) forming the respective portions of the semiconductor laser, to mutually diffuse, thus making laser oscillation impossible.

SUMMARY OF THE INVENTION

It is a first object of the present invention to provide a semiconductor laser in which the leak electric current flowing between the block layers and the first upper clad layer is small, thus making the oscillation efficiency high, and also to provide a method of producing the semiconductor laser above-mentioned.

It is a second object of the present invention to provide a semiconductor laser having no etching stop layer between the block layers and the first upper clad layer, and also to provide a method of producing the semiconductor laser above-mentioned.

It is a third object of the present invention to provide a mass-productive semiconductor laser in which only the etching stop layer can be removed with high precision, and also to provide a method of producing the semiconductor laser above-mentioned.

A semiconductor laser according to the present invention comprises: a lower clad layer, an active layer, a first upper clad layer, and a dry-etching stop layer, all these layers being successively laminated in this order on a compound semiconductor substrate; a second upper clad layer in the form of a ridge disposed above the first upper clad layer; an etching stop layer present only between the dry-etching stop layer and the second upper clad layer; and block layers formed at sides of the second upper clad layer.

According to the present invention, the etching stop layer is not present between the block layers and the first upper clad layer. Accordingly, the current confinement effect for the second upper clad layer is well produced. Thus, the semiconductor laser having the arrangement above-mentioned has a high oscillation efficiency.

According to the arrangement above-mentioned, it is preferred that each of the dry-etching stop layer, the first upper clad layer and the second upper clad layer is a compound semiconductor of the AlGaInP type, that the etching stop layer is a compound semiconductor of the GaInP type, and that the dry-etching stop layer is higher in Al concentration than the first upper clad layer.

By making the dry-etching stop layer higher in Al concentration than the first upper clad layer, the band barrier between the dry-etching stop layer and the block layers becomes higher. This increases the current confinement effect for the ridge portion.

A semiconductor laser producing method according to the present invention comprises the steps of: successively forming, on a compound semiconductor substrate, a lower clad layer, an active layer, a first upper clad layer, an etching stop layer, and a second upper clad layer in this order; etching the second upper clad layer, into the form of a ridge, up to the etching stop layer; removing, by dry-etching, the etching stop layer exposed after the etching step above-mentioned; and selectively growing block layers at sides of the second upper clad layer in the form of a ridge.

According to the present invention, the semiconductor laser producing method may further comprise, after the first upper clad layer has been formed and before the etching stop layer is formed, the step of forming a dry-etching stop layer on the first upper clad layer.

By forming, under the etching stop layer, a dry-etching stop layer resistant to dry-etching, only the etching stop layer can selectively be removed with high precision. More specifically, by adopting dry-etching as a method of removing the etching stop layer, there can be utilized the dry-etching stop layer which improves the etching precision.

According to the producing method above-mentioned, semiconductor lasers each having no etching stop layer between the block layers and the first upper clad layer, can be mass-produced with high precision. Accordingly, the semiconductor lasers obtained by this producing method are excellent in current confinement effect for the second upper clad layer, thus providing a high oscillation efficiency.

According to the producing method above-mentioned, the temperature of the substrate is never raised to high temperature. Accordingly, the elements forming the respective portions of the semiconductor laser do not mutually diffuse. This maintains the satisfactory characteristics of the semiconductor laser.

According to the method above-mentioned, it is preferred that each of the dry-etching stop layer, the first upper clad layer and the second upper clad layer is a compound semiconductor of the AlGaInP type, that the etching stop layer is a compound semiconductor of the GaInP type, and that the dry-etching stop layer is higher in Al concentration than the first upper clad layer.

For example, when dry-etching is conducted with the use of a chlorine-type gas, a semiconductor having a composition of the AlGaInP type is resistant to such dry-etching. Accordingly, when dry-etching is conducted with a dry-etching stop layer having such a composition formed under the etching stop layer, the layers to be etched (including the etching stop layer) can selectively be removed in a good manner.

These and other features, objects, advantages and effects of the present invention will be more fully apparent from the following detailed description set forth below when taken in conjunction with the accompanying drawings.

DESCRIPTION OF THE PREFERRED EMBODIMENTS

Figure 1:
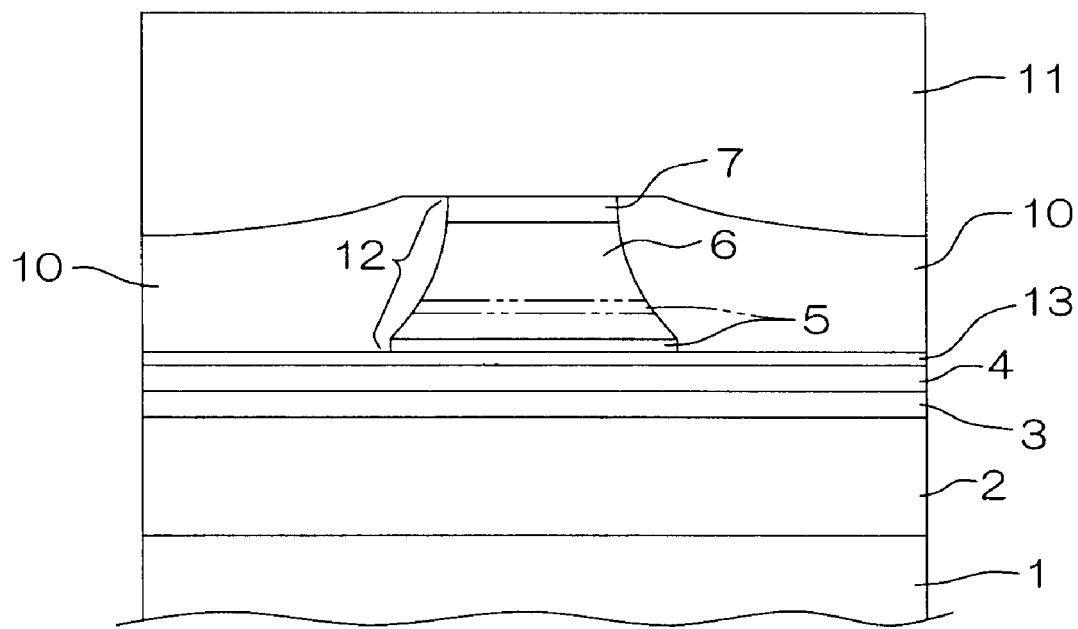
FIG. 1 is a schematic section view illustrating the arrangement of a ridge-type semiconductor laser according to an embodiment of the present invention.

FIG. 1 is a schematic section view illustrating the arrangement of a ridge-type semiconductor laser according to an embodiment of the present invention. A lower clad layer 2, an active layer 3, a first upper clad layer 4 and a dry-etching stop layer 13 are successively laminated on a compound semiconductor substrate 1 in this order from the substrate 1. A ridge portion 12 is formed on the dry-etching stop layer 13. In this ridge portion 12, the etching stop layer 5, the second upper clad layer 6 and the contact layer 7 are laminated and generally shaped in the form of a ridge.

The etching stop layer 5 is present only under the second upper clad layer 6.

At both sides of the ridge portion 12, block layers 10 are formed on the dry-etching stop layer 13. A cap layer 11 is formed on the contact layer 7 and the block layers 10.

The substrate 1 is for example made of a GaAs compound semiconductor. Each of the lower clad layer 2, the first upper clad layer 4, the dry-etching stop layer 13, and the second upper clad layer 6 is a compound semiconductor having a composition of the AlGaInP type. The Al concentration of the dry-etching stop layer 13 is larger than that of the first upper clad layer 4. The dry-etching stop layer 13 may be formed as the surface layer portion of the first upper clad layer 4. More specifically, the Al concentration of the first upper clad layer 4 in the vicinity of the surface thereof, may be made high, and this surface zone may serve as the dry-etching stop layer 13. The active layer 3 is a compound semiconductor having a composition of the AlGaInP type or the GaInP type. The etching stop layer 5 is a compound semiconductor having a composition of the GaInP type.

Each of the contact layer 7, the block layers 10 and the cap layer 11 maybe a compound semiconductor having a composition of the GaAs type.

The conduction type of each of the substrate 1, the lower clad layer 2, and the block layers 10 is the first conduction type (e.g., n type). The conduction type of each of the first upper clad layer 4, the second upper clad layer 6, the contact layer 7 and the cap layer 11 is the second conduction type (e.g., p type). The conduction type of the active layer 3 is the first or second conduction type, or undoped. The conduction type of each of the dry-etching stop layer 13 and the etching stop layer 5 is the second conduction type or undoped.

In this semiconductor laser, the etching stop layer 5 is not present between the first upper clad layer 4 and the block layers 10. Further, the dry-etching stop layer 13 is higher in Al concentration than the first upper clad layer 4. Accordingly, the band barrier between the dry-etching stop layer 13 and the block layers 10 becomes higher. It is therefore possible to securely confine the electric current in the ridge portion 12, thus achieving a high oscillation efficiency.

According to the arrangement in FIG. 1, the etching stop layer 5 is formed as being in contact with the dry-etching stop layer 13. However, the etching stop layer 5 may be formed at a suitable intermediate position in the thickness direction of the second upper clad layer 6, as shown by the phantom lines in FIG. 1. In the semiconductor laser having such an arrangement, too, the electric current can securely be confined in the ridge portion 12, and the oscillation efficiency is therefore high.

FIG. 2(a) to FIG. 2(f) are schematic section views illustrating the steps of producing the semiconductor laser above-mentioned.

Successively formed on the substrate 1 are the lower clad layer 2, the active layer 3, the first upper clad layer 4, the dry-etching stop layer 13, the etching stop layer 5, the second upper clad layer 6 and the contact layer 7. A mask layer 8 composed of $SiO_2$ or SiN is formed on the surface of the contact layer 7.

Figure 2A:
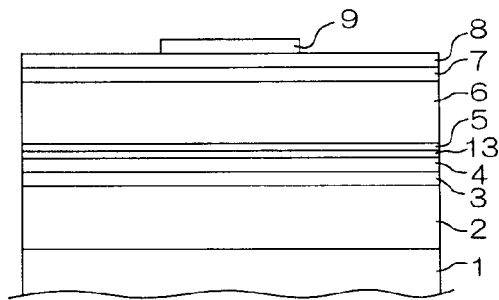
FIG. 2(a)~FIG. 2(f) are schematic section views illustrating the steps of producing the semiconductor laser according to the embodiment in FIG. 1.
Figure 2D:
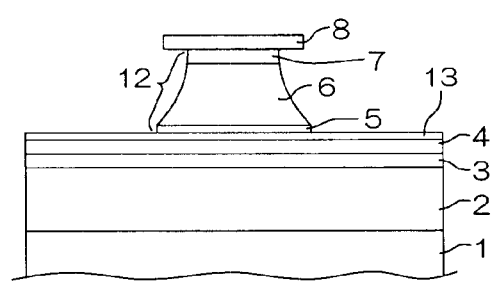
Figure 2B:
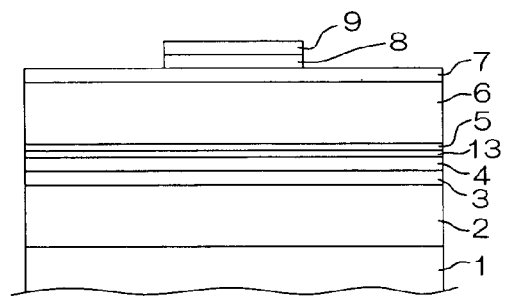

Then, a resist 9 is formed on the mask layer 8 by a photolithography method (FIG. 2(a)), and the mask layer 8 is etched in stripe (FIG. 2(b)). Then, the resist 9 is removed, and the contact layer 7 and the second upper clad layer 6 are wet-etched in the form of a ridge. As an etching solution, there may be used a solution of the sulfuric acid type, the oxalic acid type, or the hydrochloric acid type. In such an etching solution, the etching rate for a compound semiconductor having a composition of the AlGaInP type is faster as the Al concentration is higher. Accordingly, the etching stop layer 5 having a composition of the GaInP type is resistant to the etching solution. Thus, the layers on and lower than the etching stop layer 5 are not etched (FIG. 2(c)).

The etching stop layer 5 exposed after the second upper clad layer 6 has been etched in the form of a ridge, is removed by dry-etching (FIG. 2(d)). This step can be dry-etching using chlorine gas. The etching pressure is preferably 10 mTorr or less. Under these conditions, the etching stop layer 5 having a composition of the InGaP type can selectively be etched with respect to the second upper clad layer 6 having a composition of the AlGaInP type. A small amount of fluorine gas may be mixed with chlorine gas.

The dry-etching stop layer 13 is resistant to dry-etching using chlorine gas. Accordingly, the layers on and lower than the dry-etching stop layer 13 are not etched (FIG. 2(d)). More specifically, etching can securely be stopped at the dry-etching stop layer 13 by using a dry-etching method as a method of removing the etching stop layer 5.

Figure 2E:
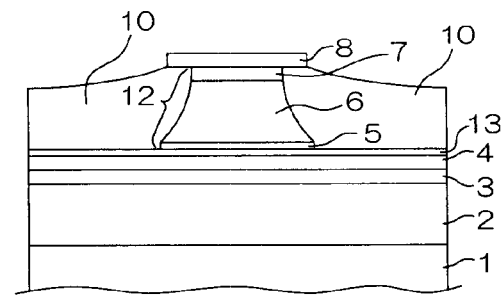
Figure 2C:
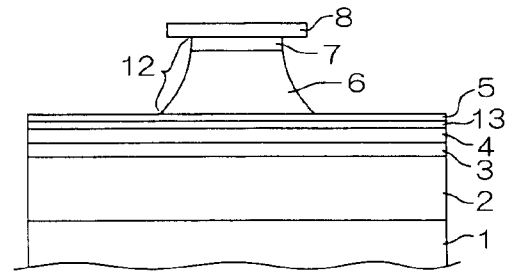
Figure 2F:
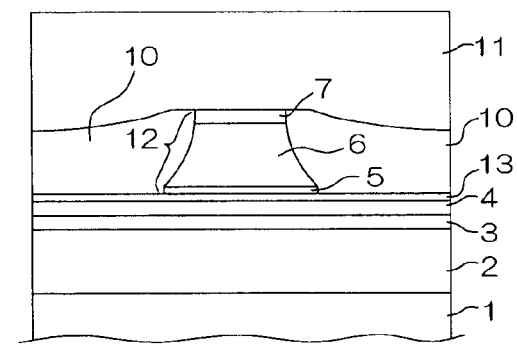
Figure 3:
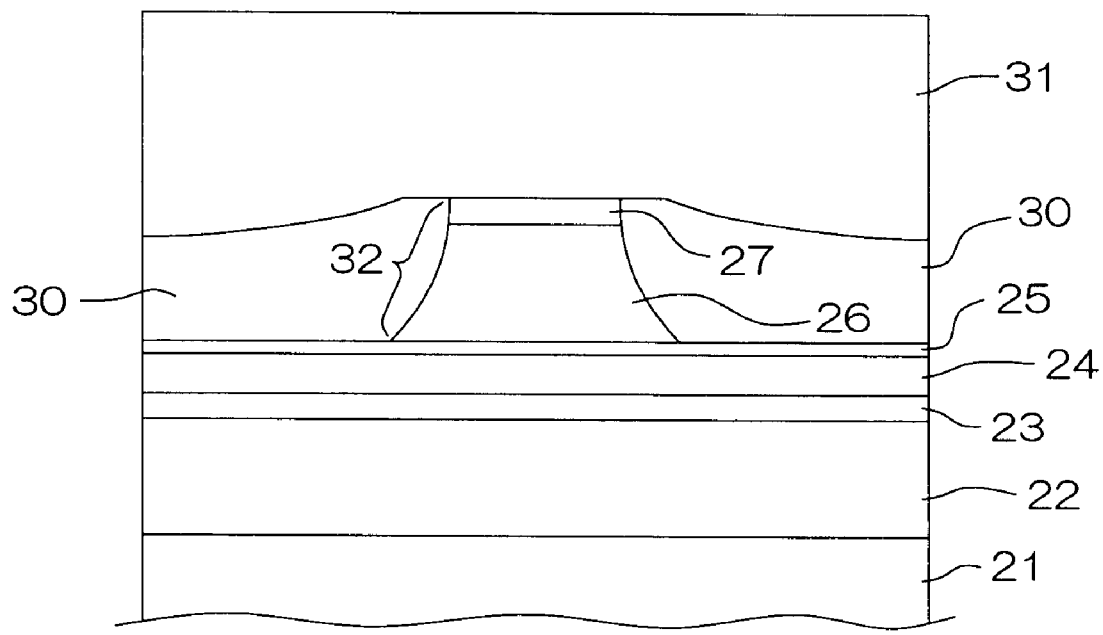
FIG. 3 is a schematic section view illustrating the arrangement of a ridge-type semiconductor laser of prior art.
Figure 4A:
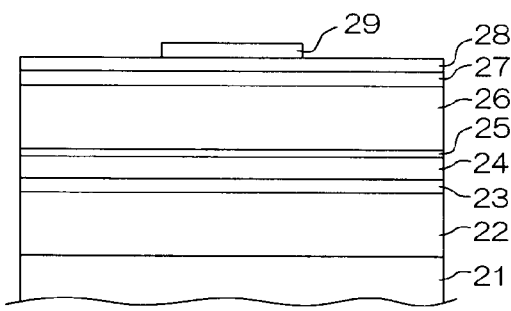
FIG. 4(a)~FIG. 4(e) are schematic section views illustrating the steps of producing the ridge-type semiconductor laser of prior art in FIG. 3.
Figure 4D:
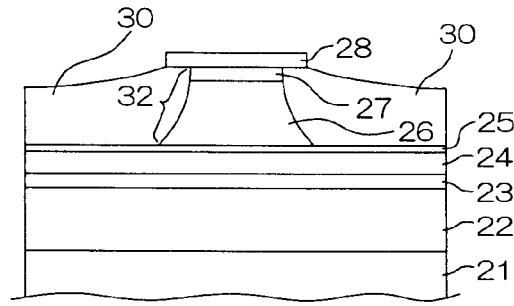
Figure 4B:
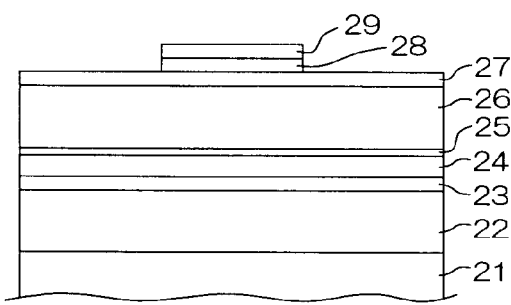
Figure 4E:
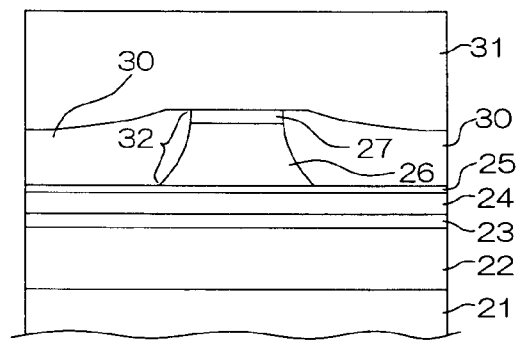
Figure 4C:
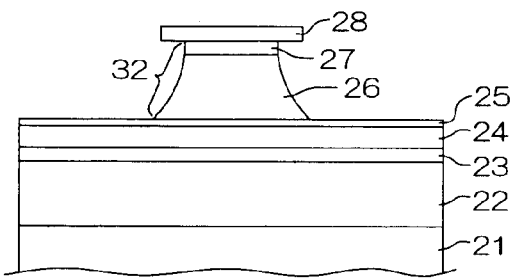

Then, the block layers 10 are formed at both sides of the ridge portion 12 (FIG. 2(e)). Thereafter, the mask layer 8 is removed by etching, and the cap layer 11 is formed on the block layers 10 and the contact layer 7 (FIG. 2(f)).

According to the producing method above-mentioned, semiconductor lasers can be mass-produced. Further, the resultant semiconductor laser has no etching stop layer 5 between the first upper clad layer 4 and the block layers 10. Further, the dry-etching stop layer 13 produces a good current confinement effect for the ridge portion 12 since the dry-etching stop layer 13 is higher in Al concentration than the first upper clad layer 4.

According to the production steps above-mentioned, there is no possibility of the semi-finished products being raised to high temperatures. This prevents the elements (including dopants) forming the semiconductor laser from mutually diffusing. Thus, the characteristics of the semiconductor laser can be satisfactory.

The first upper clad layer 4 having a normal composition is hardly etched under the dry-etching conditions above-mentioned. Accordingly, provision may be made such that the step of forming, on the first upper clad layer 4, the dry-etching stop layer 13 having a composition of the AlGaInP type, is omitted and that the etching stop layer 5 is laminated on the first upper clad layer 4.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application Serial No.2000-391120 filed on Dec. 22, 2000 with Japanese Patent Office, the disclosure of which is incorporated herein by reference.

I claim:

1. A semiconductor laser comprising:
   a lower clad layer laminated on a compound semiconductor substrate;
   an active layer laminated on said lower clad layer;
   a first upper clad layer laminated on said active layer;
   a dry-etching stop layer formed on said first upper clad layer;
   a second upper clad layer in a form of a ridge formed above said first upper clad layer;
   an etching stop layer present only between said dry-etching stop layer and said second upper clad layer; and
   block layers formed at sides of said second upper clad layer.

2. A semiconductor laser according to claim 1, wherein the dry-etching stop layer is formed by a surface layer portion of said first upper clad layer.

3. A semiconductor laser according to claim 1, wherein the etching stop layer is formed in an intermediate portion in a thickness direction of said second upper clad layer.

4. A semiconductor laser according to claim 1, wherein said dry-etching stop layer is higher in aluminum concentration than said first upper clad layer.

* * * * *